United States Patent [19]
Akagawa

[11] Patent Number: 5,677,576
[45] Date of Patent: Oct. 14, 1997

[54] CHIP SIZED SEMICONDUCTOR DEVICE

[75] Inventor: Masatoshi Akagawa, Nagano, Japan

[73] Assignee: Shinko Electric Industries Co., Ltd., Nagano, Japan

[21] Appl. No.: 618,807

[22] Filed: Mar. 20, 1996

[30] Foreign Application Priority Data

Mar. 24, 1995 [JP] Japan .................. 7-065609

[51] Int. Cl.⁶ .......................... H01L 23/48; H01L 29/40
[52] U.S. Cl. ...................... 257/785; 257/737; 257/786
[58] Field of Search ................................ 257/737, 786, 257/778, 783, 785

[56] References Cited

U.S. PATENT DOCUMENTS

| | | | |
|---|---|---|---|
| 4,811,081 | 3/1989 | Lyden | 257/786 |
| 5,113,241 | 5/1992 | Yanagida et al. | 257/786 |

FOREIGN PATENT DOCUMENTS

| | | |
|---|---|---|
| 0 368 262 | 5/1990 | European Pat. Off. . |
| 0 684 644 | 11/1995 | European Pat. Off. . |
| 2 673 043 | 8/1992 | France . |
| 1-122128 | 5/1989 | Japan . |
| 8-97217 | 4/1996 | Japan . |
| 94/24704 | 10/1994 | WIPO . |

OTHER PUBLICATIONS

Patent Abstract of Japan No. 3244140, vol. 16, No. 31 (Jan. 27, 1992).
Patent Abstract of Japan No. 60-116157, vol. 9, No. 270 (Jun. 22, 1985).
Patent Abstract of Japan No. 63-4633, vol. 12, No. 207 (Jan. 9, 1988).

*Primary Examiner*—Tom Thomas
*Assistant Examiner*—David Ostrowski
*Attorney, Agent, or Firm*—Staas & Halsey

[57] ABSTRACT

A chip sized semiconductor device includes a semiconductor chip having upper and lower surfaces. The chip has electrodes formed on the upper surface thereof. An electrically insulating passivation film is formed on the upper surface of the semiconductor chip, except for areas where the electrodes exist. An anisotropic conductive sheet has an upper surface providing with a circuit pattern formed thereon and a second surface being adhered to the passivation film. The circuit pattern has inner and outer connecting portions. The electrically insulating film covers the upper surface of the anisotropic conductive sheet so that the outer connecting portions of the circuit pattern are exposed to be connected to external connecting terminals. The anisotropic conductive sheet is partially pressed at positions correspond to the electrodes, so that the inner portions of the circuit pattern are electrically connected to said electrodes of the semiconductor chip.

12 Claims, 3 Drawing Sheets

Fig.7(a)
PRIOR ART
Fig.7(b)
PRIOR ART
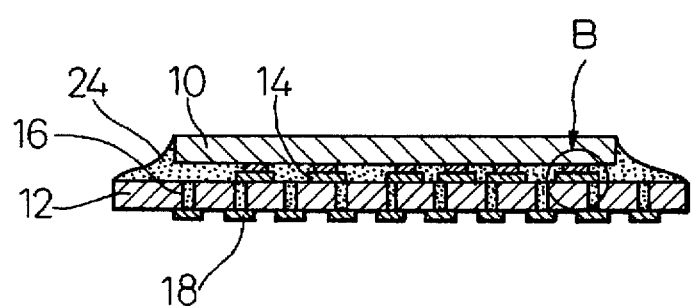
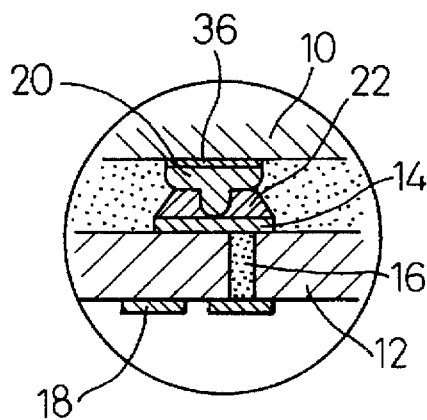

CHIP SIZED SEMICONDUCTOR DEVICE

BACKGROUND OF THE INVENTION

1. Field of the Invention

The present invention relates to a semiconductor device and, more particularly, to a chip sized semiconductor device.

2. Description of the Related Art

There has been a demand for miniaturizing a semiconductor device on which a semiconductor chip is mounted, for the purpose of increasing the mounting density thereof. The miniaturization of the semiconductor device means the miniaturization of a package in which the chip is sealed. To satisfy the demand, a chip sized package (CSP) has been recently developed.

There are various types in CSP, one of which is illustrated in FIGS. 7(a) and 7(b).

Reference numerals 10 and 12 denote a semiconductor chip and a ceramic substrate, respectively. The ceramic substrate 12 is shaped so as to have substantially the same size as the semiconductor chip 10. Circuit patterns 14 are formed on the ceramic substrate 12 and connected to lands (external terminals) 18 provided at predetermined positions on the lower side of the ceramic substrate 12 through via-holes 16. The semiconductor chip 10 is connected to the circuit pattern 14 via gold (Au) bumps 20 and silver-paradium (AgPd) pastes 22, and a gap between the semiconductor chip 10 and the ceramic substrate 12 is sealed with a resin 24.

According to the above-mentioned chip-sized semiconductor device known in the prior art, although it is possible to achieve the miniaturization, the production cost increases because the ceramic substrate 10 and Au bumps 20 are used.

SUMMARY OF THE INVENTION

Accordingly, the present invention has been made to solve the above problems, and an object thereof is to provide a chip sized semiconductor device which has a simple structure to be easily produced at a low cost.

According to an aspect of the present invention, there is provided a chip sized semiconductor device comprising: a semiconductor chip having first and second surfaces, said chip having electrodes formed on at least one of said surfaces; an electrically insulating passivation film formed on said one surface of the semiconductor chip except for areas where said electrodes exist; an anisotropic conductive sheet having first and second surfaces, said first surface providing with a circuit pattern formed thereon and said second surface being adhered to said passivation film, said circuit pattern having first and second portions; an electrically insulating film for covering said first surface of said anisotropic conductive sheet so that said first portions of the circuit pattern are exposed to be connected to external connecting terminals; and said second portions of the circuit pattern being electrically connected to said electrodes of the semiconductor chip by means of said anisotropic conductive sheet.

In one embodiment, said anisotropic conductive sheet is mechanically pressed partially at positions correspond to said electrodes, so that said second portions of the circuit pattern are electrically connected to said electrodes of the semiconductor chip.

In another embodiment, said electrodes of the semiconductor chip are provided with conductive bumps which protrude outward over said passivation film, so that said anisotropic conductive sheet is partially pressed by said bumps and, therefore, said second portions of the circuit pattern are electrically connected to said electrodes of the semiconductor chip.

In still another embodiment, said electrically insulating film for covering said first surface of said anisotropic conductive sheet is a photoconductive solder resist film.

In further embodiment, said external connecting terminals are solder bumps.

In still another embodiment, said semiconductor chip has a peripheral side surface in addition to said first, upper and second, lower surfaces, and said peripheral side surface is protected by a protective cover or frame.

In still further embodiment, semiconductor chip is mounted on a provided heat spreader so that the other surface of the chip is in contact with said heat spreader.

Since the anisotropic conductive sheet used as an interposer and the electro-insulation film can be formed to be thinner according to the semiconductor device of the present invention, it is possible to obtain a thin semiconductor device at a reduced cost.

Since the hardness of the anisotropic conductive sheet and the electro-insulation film are not so high, these sheets of films can function as shock-absorbing layers for protecting the surface of the semiconductor chip and mitigating a thermal or mechanical stress generated between the semiconductor chip and the substrate carrying the same.

According to another aspect of the present invention, there is provided a chip sized semiconductor device comprising: a plurality of semiconductor chips arranged side by side, said chips having first and second common surfaces, said chips having electrodes formed on at least one of said common surfaces; an electrically insulating passivation film formed on said one common surface of the semiconductor chips, except for areas where said electrodes exist; an anisotropic conductive sheet having first and second surfaces, said first surface providing with a circuit pattern formed thereon and said second surface being adhered to said passivation film, said circuit pattern having first and second portions; an electrically insulating film for covering said first surface of said anisotropic conductive sheet so that said first portions of the circuit pattern are exposed to be connected to external connecting terminals; and said second portions of the circuit pattern being electrically connected to said electrodes of the semiconductor chip by means of said anisotropic conductive sheet.

Since predetermined electrodes of a plurality of semiconductor chips are electrically connected to each other, it is possible to improve the electric properties; for example, to prevent signal delay. Since the anisotropic conductive sheet and the electro-insulation film are commonly formed, it is possible to easily produce the device.

BRIEF DESCRIPTION OF THE DRAWINGS

FIG. 7(a) is a side sectional view of a semiconductor device conventially known in the prior art; and FIG. 7(b) is an enlarged view of area B indicated in FIG. 7(a).

DESCRIPTION OF THE PREFERRED EMBODIMENTS

Figure 1:
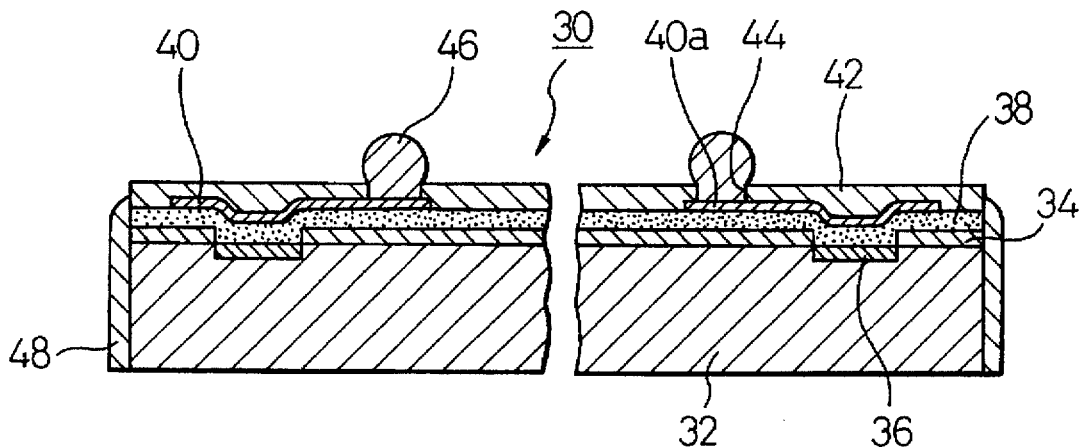
FIG. 1 is a side sectional view of a semiconductor device according to a first embodiment of the present invention.

The present invention will be described below in more detail with reference to the preferred embodiments illustrated in the attached drawings, wherein FIG. 1 shows a side-sectional view of a chip sized semiconductor device according to a semiconductor device 30 of the first embodiment.

Reference numeral 32 denotes a semiconductor chip; 34 an insulating passivation film formed of $SiO_2$, SiN or the like; and Al 36 pads (pad sections) which are built-in electrodes in the semiconductor chip 32. The passivation film 34 is not formed in areas where the Al pads 36 exist and the pads are exposed in these areas. A plurality of Al pads 36 are formed on the semiconductor chip 32 in a predetermined pattern.

A known anisotropic conductive sheet 38 is formed to cover the passivation film 34. The anisotropic conductive sheet 38 is formed of resin containing conductive fillers 39 (see FIG. 2) such as metallic powders and, by the application of pressure, becomes conductive in the pressed direction due to the continuity of the conductive fillers 39 caused by the pressure. The metallic powders may be, for example, metallic particles consisting of resin particles coated with Ni-plated layers or the like, or metallic particles consisting of Au, Ni or the like.

Figure 2:
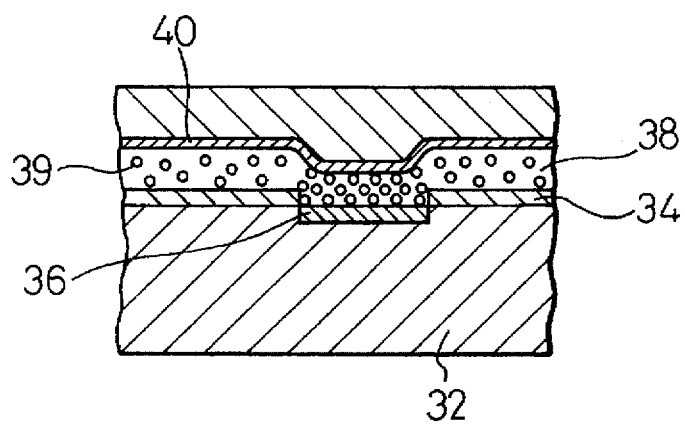
FIG. 2 is a partially enlarged view of FIG. 1.

Circuit patterns 40 are formed in a predetermined arrangement on the anisotropic conductive sheet 38. As shown in FIG. 2, the circuit pattern 40 is formed so that it is pressed into the anisotropic conductive sheet 38, whereby the anisotropic conductive sheet 38 is compressed in these zones to be conductive and the Al pads 36 are electrically connected to the circuit patterns 40.

The circuit patterns 40 are formed by adhering a metallic foil, such as a copper foil, to the anisotropic conductive sheet 38 and etching the foil in conformity with a predetermined configuration. Alternatively, a sputtering method may be adopted to provide a metallic foil of copper or aluminum, which is then etched to obtain the predetermined circuit patterns.

A photo-resist film (electro-insulation film) 42 covers the anisotropic conductive sheet 38 and the circuit patterns 40.

The photo-resist film 42 is a protective film for the circuit patterns 40, and may be formed of a photosensitive or photoconductive solder resist of various materials.

Via-holes 44 are provided in a matrix manner at suitable positions on the photo-resist film 42, corresponding to the respective circuit patterns 40. Portions of the circuit pattern 40 exposed outside through the via-hole 44 form contacts 40a to which external terminals are to be connected.

Conductive bump 46 provide external terminals which are electrically connected to the respective contacts 40a via the via-holes 44 and bulge out from the photo-resist film 42.

The bumps 46 are not restricted to solder ball bumps as illustrated in FIG. 1, but may be of any suitable shape, such as, flat land shapes or others. Alternatively, lead pins may be connected therewith to form the external pin terminals.

A protective film 48 covers side walls of the semiconductor chip 32, the passivation film 34 and the anisotropic conductive sheet 38 for the purpose of inhibiting moisture invasion through the boundaries between the respective layers. Such a protective film 48 can be formed of any suitable resist resin, but is not indispensable to the present invention. Also, a metallic frame may also be fixed to the semiconductor device instead of the protective film 48.

According to the above structure as mentioned with reference to the first embodiment, it is possible to obtain a semiconductor device 30 having substantially the same size as the semiconductor chip 32.

Since it is possible to reduce the thickness of the anisotropic conductive sheet 38 and the photo-resist film 42, which are used as interposers, it is also possible to obtain a thin semiconductor device 30.

Since the hardness of the anisotropic conductive sheet 38 and that of the photo-resist film 42 are not so high, they can function as shock-absorbing layers for protecting the surface of the semiconductor chip 32.

In this regard, the opposite, lower surface of the semiconductor chip 32 is preferably exposed to enhance heat radiation. To further enhance heat radiation, a heat sink or a heat spreader (not shown) may be fixed thereon.

Figure 3:
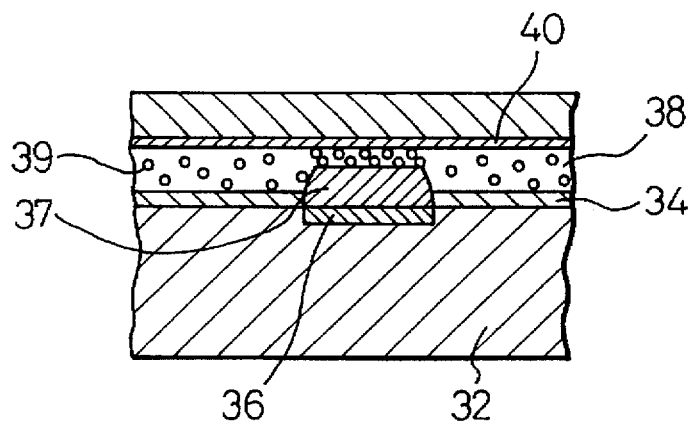
FIG. 3 is a partial side sectional view of a semiconductor device according to another embodiment of the present invention.

FIG. 3 illustrates a semiconductor device according to another embodiment of a semiconductor device.

According to this embodiment, bumps 37 formed of, for example Au or Pd, are provided on the respective Al pads 36 of a semiconductor chip 32 to project upward so that the bumps 37 are higher than the passivation film 34. Therefore, an anisotropic conductive sheet 38 is pressed by the projected bumps 37 to be electrically conductive when the anisotropic conductive sheet 38 is fixed to the passivation film 34. Thus, the Al pads 36 are electrically connected to the circuit patterns 40.

The other parts of this embodiment are the same as those of the first embodiment shown in FIG. 1, and therefore a detailed explanation and an illustration thereof are omitted. Also the functions and effects of this embodiment are substantially the same as those of the previous embodiment.

Figure 4:
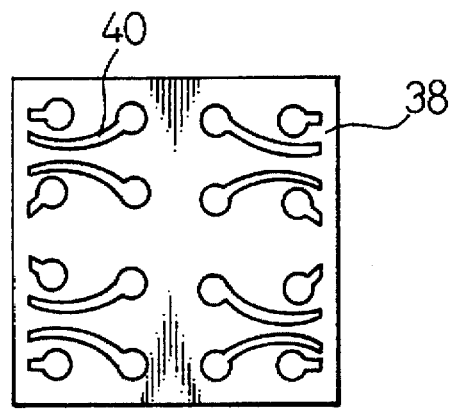
FIG. 4 is an illustration for explaining an isotropic conductive sheet on which circuit patterns are provided.
Figure 5:
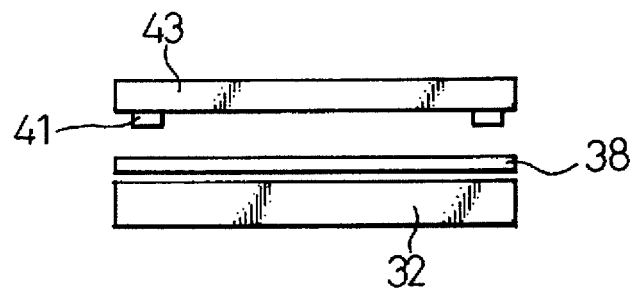
FIG. 5 is an illustration for explaining a press-bonding jig for thermally press-bonding the isotropic conductive sheet.

FIGS. 4 and 5 illustrate a process for producing a semiconductor device 30 as shown in FIG. 1.

As shown in FIG. 4, a metallic foil such as a copper foil is adhered onto an anisotropic conductive sheet 38 and etched through a known photolithographic process to form predetermined circuit patterns 40. Alternatively, a metallic layer may be formed by a sputtering process or the like and etched to form the circuit patterns 40.

The anisotropic conductive sheet 38 carrying the circuit patterns 40 thereon is overlapped with a passivation film 34 of a semiconductor chip 32 while care is taken that the circuit patterns 40 coincides with the Al pads 36 corresponding thereto, as shown in FIG. 5.

Then, the circuit patterns 40 and the anisotropic conductive sheet 38 are pressed together, under the application of heat, by a press-bonding tool 43 with pressing projections 41 arranged in accordance with the arrangement of the Al pads 36, whereby the anisotropic conductive sheet 38 is thermally press-bonded to the passivation film 34. For example, the anisotropic conductive sheet 38 is heated to a temperature of a hundred, several decade to 200° C. and pressed for 20 to 30 seconds by using a thermosetting mold.

During the above process, the circuit patterns 40 are pressed by the pressing projections 41 and are deformed as shown in FIG. 2, whereby the anisotropic conductive sheet 38 is pressed at these points to be in conductive contact with the Al pads 36. Thus, the circuit patterns 40 and the Al pads 36 are electrically connected to each other.

Next, to form the electro-insulation film 42, a photo-resist (photosensitive solder resist) is coated on the anisotropic conductive sheet 38 and the circuit pattern 40. After the exposure and development, via-holes 44 are formed. In this regard, the electro-insulation film 42 may be preliminarily provided on the anisotropic conductive sheet 38 and the circuit pattern 40, and then the anisotropic conductive sheet 38 is bonded onto the semiconductor chip 32.

The via-holes 44 are filled with solder balls (i.e., solder bumps 46) which in turn are fixed onto the circuit pattern 40 through a reflow process.

A semiconductor device 30 is now completed as stated above. If necessary, a resist may be coated on side walls of the semiconductor device 30 and dried to form a protective film 48 for covering the side surfaces of the semiconductor device 30.

Although, in the above embodiment, a semiconductor chip 32 formed as a single body is used, a wafer in which a plurality of semiconductor chips 32 are built in may be used. In this case, an anisotropic conductive sheet 38, circuit patterns 40, a photo-resist film 42 and bumps 46 are first formed on the wafer in a similar manner as described above. Thereafter, the wafer is sliced into individual pieces to simultaneously provide a number of semiconductor device 30 at a lower cost. The circuit patterns 40 may be formed after the anisotropic conductive sheet 38 has been bonded to the semiconductor chip 32.

A method for producing the semiconductor device 30 shown in FIG. 3 will be described below. First, gold bumps 37 are preliminarily formed on the Al pads 36 of the semiconductor chip 32. Then the anisotropic conductive sheet 38 on which the circuit pattern 40 shown FIG. 4 is provided is overlapped with the gold bumps 37, and thermally press-bonded to the latter. In this embodiment, the press-bonding tool 43 with pressing projections 41 is unnecessary. That is, when the isotropic conductive sheet 38 is heated to a temperature of a hundred several decade to 200° C. and pressed for 20 to 30 seconds by using a thermosetting mold, the anisotropic conductive sheet 38 is locally compressed by the gold bumps 37 and is locally conductive. The photo-resist film 42 and the bump 46 may be provided in the same manner as the above embodiment.

In this regard, the circuit patterns 40 may be provided after the anisotropic conductive sheet 38 has been thermally press-bonded. Also, it is possible to preliminarily form the electro-insulation film 42 on the isotropic conductive sheet 38 and the circuit pattern 40 and then bond the anisotropic conductive sheet 38 onto the semiconductor chip 32.

Figure 6:
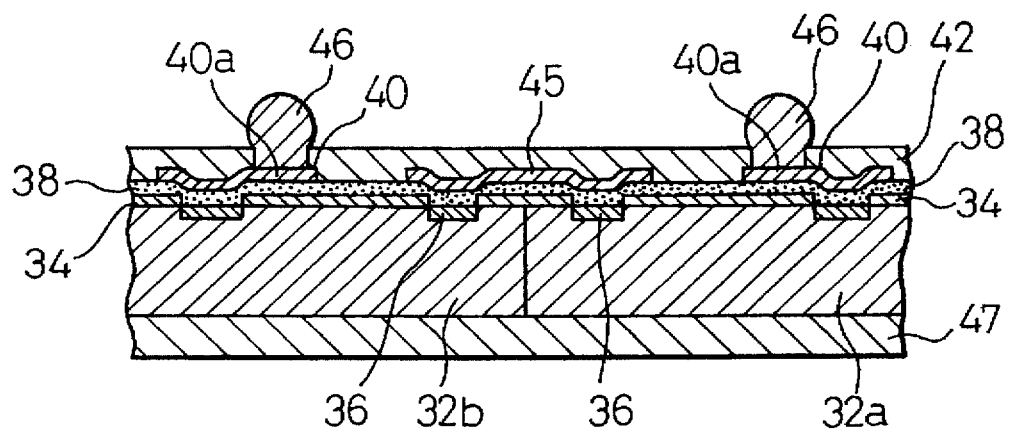
FIG. 6 is a partial side sectional view of a semiconductor device according to a further embodiment of the present invention.

FIG. 6 illustrates a further embodiment of a semiconductor device of this invention.

According to this embodiment, a plurality of semiconductor chips 32a, 32b are arranged side by side and mounted on a common substrate 47, such as a heat spreader or the like. An anisotropic conductive sheet 38 is commonly provided on the plurality of semiconductor chips 32a, 32b in the same manner as the embodiment described above. Then, circuit pattern 40 corresponding to the respective semiconductor chips 32a, 32b and circuit pattern 45 for connecting electrodes 36 necessary for electrically connecting adjacent semiconductor chips to each other are formed in the same manner as the embodiment described above. Thereafter, an electro-insulation film 42 is provided to commonly cover them, while forming bumps 46 on respective contacts 40a for the connection with external terminals of the respective circuit patterns 40.

That is, the plurality of semiconductor chips 32a, 32b are built onto a single semiconductor device 30 to form a multi-chip module.

In this embodiment, the plurality of semiconductor chips 32 may be a combination of a micro-processor unit, (MPU) and a cache memory, or a series of memories.

According to this embodiment, since the plurality of semiconductor chips are mounted onto the common substrate 47 and the electrodes thereof are electrically connected to each other via a circuit pattern, it is possible to shorten the lengths of the wires, whereby a semiconductor device excellent in electrical properties is obtainable, such as low signal delay. Also, since the anisotropic conductive sheet and the electro-insulation film can be commonly formed, the production of the semiconductor device becomes easy. In this regard, if the plurality of semiconductor chips 32 were held by a common frame (not shown), the substrate 47 is unnecessary. Otherwise, it is also possible to form the plurality of semiconductor chips on a common wafer.

The semiconductor device according to this embodiment can be produced through the same process as described above.

In the above mentioned embodiments, the circuit pattern 40 is formed of a metallic foil, such as a copper foil. However, in place of the circuit pattern 40, it is also possible to obtain the equivalent by pressing the anisotropic conductive sheet 38 in conformity with the configuration of the circuit pattern 40 by means of any suitable pressing means or the like so that the pressed portions of the anisotropic conductive sheet 38 become conductive. In this case, the anisotropic conductive sheet 38 can be used as the circuit pattern 40. In such a manner, the production process is shortened to further reduce the production cost. Thus, the circuit patterns used in the present invention include those formed by pressing the isotropic conductive sheet.

The present invention was explained with reference to the preferred embodiments. The present invention, however, should not be restricted to these embodiments, but includes various changes and modifications thereof without departing from the gist of the present invention.

According to the semiconductor device of the present invention, since the isotropic conductive sheet and the electro-insulation film can be formed to be thin as described above, the thickness of the semiconductor device can be reduced to save the production cost thereof.

Since the hardness of the isotropic conductive sheet and the electro-insulation film is not so high, there is a merit in that they can function as a shock absorbing layer for protecting the semiconductor chip surface and/or mitigating thermal or mechanical stress generated between the semiconductor chip and the mounting substrate.

Also, it is possible to improve electrical properties of the semiconductor device, for example, to be free from signal delay, by electrically connecting electrodes of a plurality of semiconductor chips with each other. By commonly forming the isotropic conductive sheet and the electro-insulation film, the production of the semiconductor device becomes easy.

In the prior art regarding the connection between the electrode pads (Al Pad) and the circuit pattern, the insulation film or layer is provided with through holes, the inner walls thereof are plated with metal, or which are filled with conductive material to form vias, to electrically connect the electrode pads to the circuit pattern. However, according to the present invention, since the isotropic conductive sheet is used, such through holes or vias are no longer necessary. In addition, according to the present invention, it is possible to connect a semiconductor chip having high dense electrode pads to circuit patterns, since the area for providing through holes or vias are no longer necessary and, therefore, a high density of circuit pattern can therefore be allowed.

I claim:

1. A chip sized semiconductor device comprising:
   a semiconductor chip having first and second surfaces, said chip having electrodes formed on at least one of said surfaces;
   an electrically insulating passivation film formed on said one surface of the semiconductor chip, except for areas where said electrodes exist;
   an anisotropic conductive sheet having first and second surfaces, said first surface provided with a circuit pattern formed thereon and said second surface being adhered to said passivation film, said circuit pattern having first and second portions;
   an electrically insulating film for covering said first surface of said anisotropic conductive sheet so that said first portions of the circuit pattern are exposed, and on said first portions, external connecting terminals are formed;
   said second portions of the circuit pattern being electrically connected to said electrodes of the semiconductor chip by means of said anisotropic conductive sheet; and
   wherein said anisotropic conductive sheet is mechanically pressed partially at positions corresponding to said electrodes, so that said second portions of said circuit pattern are electrically connected to said electrodes of said semiconductor chip.

2. A chip sized semiconductor device as set forth in claim 1, wherein said electrodes of the semiconductor chip are provided with conductive bumps which protrude outward over said passivation film, so that said anisotropic conductive sheet is partially pressed by said bumps and, therefore, said second portions of the circuit pattern are electrically connected to said electrodes of the semiconductor chip.

3. A chip sized semiconductor device as set forth in claim 1, wherein said electrically insulating film for covering said first surface of said anisotropic conductive sheet is a photoconductive solder resist film.

4. A chip sized semiconductor device as set forth in claim 1, wherein said external connecting terminals are solder bumps.

5. A chip sized semiconductor device as set forth in claim 1, wherein semiconductor chip has a peripheral side surface in addition to said first, upper and second, lower surfaces, and said peripheral side surface is protected by a protective cover or frame.

6. A chip sized semiconductor device as set forth in claim 1, wherein said semiconductor chip is mounted on a provided heat spreader so that the other surface of the chip is in contact with said heat spreader.

7. A chip sized semiconductor device comprising:
   a plurality of semiconductor chips arranged side by side, said chips having first and second common surfaces, said chips having electrodes formed on at least one of said common surfaces;
   an electrically insulating passivation film formed on said one common surface of the semiconductor chips, except for areas where said electrodes exist;
   an anisotropic conductive sheet having first and second surfaces, said first surface provided with a circuit pattern formed thereon and said second surface being adhered to said passivation film, said circuit pattern having first and second portions; and
   an electrically insulating film for covering said first surface of said anisotropic conductive sheet so that said first positions of the circuit pattern are exposed, and on said first portions, external connecting terminals are formed;
   said second portions of the circuit pattern being electrically connected to said electrodes of the semiconductor chip by means of said anisotropic conductive sheet; and
   wherein said anisotropic conductive sheet is mechanically pressed partially at positions corresponding to said electrodes so that said second portions of said circuit pattern are electrically connected to said electrodes of each semiconductor chip.

8. A chip sized semiconductor device as set forth in claim 7, wherein said electrodes of the semiconductor chips are provided with conductive bumps which protrude outward over said passivation film, so that said anisotropic conductive sheet is partially pressed by said bumps and, therefore, said second portions of the circuit pattern are electrically connected to said electrodes of the semiconductor chips.

9. A chip sized semiconductor device as set forth in claim 7, wherein said electrically insulating film for covering said first surface of said anisotropic conductive sheet is a photoconductive solder resist film.

10. A chip sized semiconductor device as set forth in claim 7, wherein said external connecting terminals are solder bumps.

11. A chip sized semiconductor device as set forth in claim 7, wherein said plurality of semiconductor chips have a common peripheral side surface in addition to said first, upper and second, lower common surfaces, and said common peripheral side surface is protected by a protective cover or frame.

12. A chip sized semiconductor device as set forth in claim 7, wherein said semiconductor chips are mounted on a common heat spreader so that the other surfaces of the chips are in contact with said heat spreader.

* * * * *